(12) United States Patent    (10) Patent No.: US 7,760,033 B2
Podmanik et al.    (45) Date of Patent: Jul. 20, 2010

(54) RING OSCILLATORS FOR NMOS AND PMOS SOURCE TO DRAIN LEAKAGE AND GATE LEAKAGE

(75) Inventors: Milos Podmanik, Mesa, AZ (US); Iwan Grau, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 194 days.

(21) Appl. No.: 11/968,144

(22) Filed: Dec. 31, 2007

(65) Prior Publication Data

US 2009/0167445 A1    Jul. 2, 2009

(51) Int. Cl.
*H03K 3/03*    (2006.01)
(52) U.S. Cl. .................. 331/57; 331/34; 331/177 R
(58) Field of Classification Search ............ 331/34, 331/57, 177 R
See application file for complete search history.

(56) References Cited

U.S. PATENT DOCUMENTS 6,462,625 B2 * 10/2002 Kim ........................ 331/57
2005/0057315 A1 * 3/2005 Groen et al. ............. 331/57
2005/0110583 A1 * 5/2005 Deas et al. ............... 331/57
2005/0156641 A1 * 7/2005 Dimmler et al. .......... 327/156
2005/0258911 A1 * 11/2005 Higuchi et al. ........... 331/57

* cited by examiner

*Primary Examiner*—Joseph Chang
*Assistant Examiner*—Jeffrey Shin
(74) *Attorney, Agent, or Firm*—Blakely, Sokoloff, Taylor & Zafman LLP (57) ABSTRACT

A ring oscillator circuit using only NMOS or only PMOS transistors is described. The ring oscillator circuit uses the equivalent of three transistors to form an oscillator stage, which may be a main component to the ring oscillator: A load transistor, an enable transistor, and a switch transistor. A source of the load transistor may be coupled to a drain of the enable transistor and a source of the enable transistor coupled to a drain of the switch transistor. The load transistor can have three different configurations: 1) a reference circuit with a gate and a drain of the load transistor coupled together; 2) a source to drain leakage monitor circuit with a gate and a source of the load transistor coupled together; and 3) a gate leakage monitor circuit with a drain and the source of the load transistor coupled together. An odd plurality of oscillator stages can be coupled together with an input circuit and an output circuit to form a ring oscillator. Other embodiments are described.

6 Claims, 6 Drawing Sheets

RING OSCILLATORS FOR NMOS AND PMOS SOURCE TO DRAIN LEAKAGE AND GATE LEAKAGE

FIELD

This application generally relates to electrical circuits. More particularly, this application relates to a ring oscillator used to monitor source to drain leakage and gate leakage process variations for NMOS or PMOS field effect transistors and how they can be used to characterize and or monitor Si independently for NMOS and for PMOS devices.

BACKGROUND

Ring oscillator circuits can be used to monitor process variations in manufacturing transistors. Historically, ring oscillators have been constructed used complementary metal-oxide semiconductor (CMOS) logic (a combination of n-channel metal-oxide semiconductor (NMOS) transistors and p-channel metal-oxide semiconductor (PMOS)). CMOS ring oscillators may not always be able to accurately distinguish between NMOS and PMOS process variations.

BRIEF DESCRIPTION OF THE DRAWINGS

The following description can be better understood in light of the figures, in which.

The figures illustrate specific aspects of the circuits. Together with the following description, the figures demonstrate and explain the principles and operation of the circuit. In the drawings, the schematic circuit elements can represent their equivalent structures and connections. The same reference numerals in different drawings represent the same element, and thus their descriptions will not be repeated.

DETAILED DESCRIPTION

The following description supplies specific details in order to provide a thorough understanding. Nevertheless, the skilled artisan would understand the circuit operation and methods for making and using such circuits can be implemented and used without employing these specific details. A circuit element may be referred to in the circuit schematic and claims with a label to distinguish the element from other similar elements which may be coupled in a different configuration in the circuit schematic. For example, load, enable, and switch may be used to label the field effect transistor (FET) transistors used in the circuit. The term FET transistor, FET, or transistor may be used interchangeably to refer to a FET transistor. The transistor or FET can be an n-channel FET (nFET, n-type FET, n-p-n FET, or n-channel metal-oxide semiconductor (NMOS)) or p-channel (pFET, n-type FET, p-n-p FET, or p-channel metal-oxide semiconductor (PMOS)).

Figure 1:
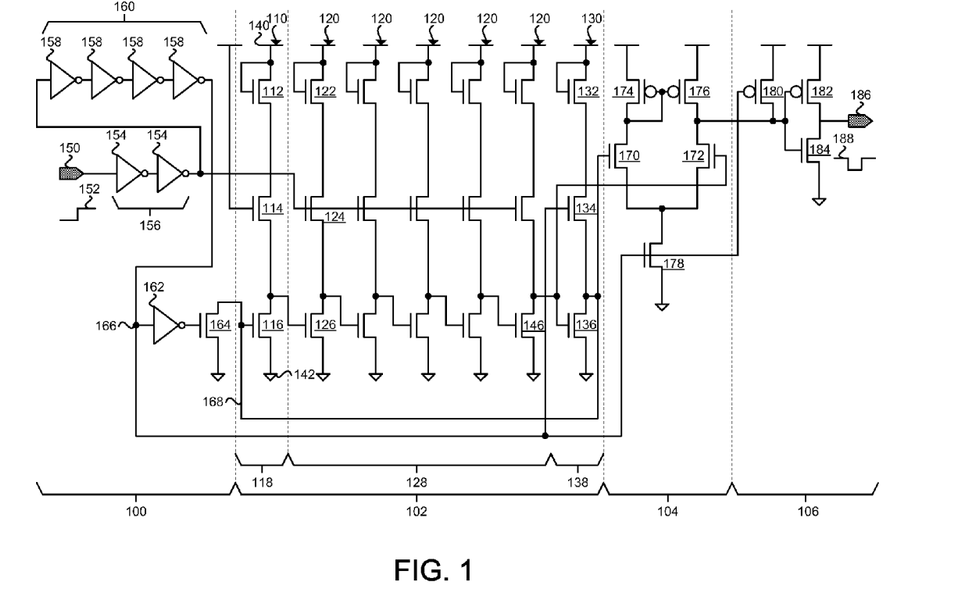
FIG. 1 illustrates a circuit schematic of some embodiments of an n-channel metal-oxide semiconductor (NMOS) reference ring oscillator circuit.

A circuit schematic of n-channel metal-oxide semiconductor (NMOS) embodiments of a reference ring oscillator circuit is shown in FIG. 1. In this embodiment, a leakage ring oscillator (RO) contains 4 sub-circuits: 1) a ring oscillator (an oscillator sub-circuit) 102; 2) a ring oscillator output pull up and enable, and delay enable logic (an input logic sub-circuit) 100; 3) an differential amplifier (an amplifier sub-circuit) 104, which can be implemented using various configurations; and 4) an optional complementary metal-oxide semiconductor (CMOS) buffer with pull up (a buffer sub-circuit) 106.

The oscillator sub-circuit 102 can include of seven stages (oscillator stages) with three transistors per stage. The seven stages can include a first stage 118, an odd plurality of middle stages 128, and a last stage 138. The odd plurality of middle stages can include five stages, so the total number of stages for the oscillator sub-circuit as shown in the embodiment of FIG. 1 is seven.

The three transistors per stage can include the equivalent of a load transistor 112, which can be embodied by those skilled in the art as multiple transistors or a single transistor; the equivalent of an enable transistor 114, which can be embodied by those skilled in the art as multiple transistors or a single transistor; and the equivalent of a switch transistor 116, which can be embodied by those skilled in the art as multiple transistors or a single transistor, as shown on the first stage. A source of the load transistor may be coupled to a drain of the enable transistor and a source of the enable transistor may be coupled to a drain of the switch transistor. The load transistor can have three different configurations: 1) a reference circuit with a gate and a drain of the load transistor (112 in FIG. 1) coupled or shorted together and coupled to a constant load voltage terminal 140; 2) a source to drain leakage monitor circuit with a gate and a source of a load transistor (212 in FIG. 2) coupled or shorted together with a drain of the load transistor coupled to a constant load voltage terminal; and 3) a gate leakage monitor circuit with a drain and the source of a load transistor (312 in FIG. 3) coupled or shorted together and coupled to a constant load voltage terminal. The enable transistor can be used to disable the oscillator and cut the current flow in an off state. The switch transistor can operate as a switch.

The load transistor 112, the enable transistor 114, and the switch transistor 116 can form a first stage oscillator circuit 110 or a first stage 1 18. A load transistor 122, an enable transistor 124, and a switch transistor 126 can form a middle stage oscillator circuit 120. A plurality of middle stage oscillator circuits can form a middle stage 128. A load transistor 132, an enable transistor 134, and a switch transistor 136 can form a last stage oscillator circuit 130 or a last stage 138. The oscillator stages can be coupled together with the drain of the switch transistor of an earlier oscillator stage is coupled to a gate of the switch transistor of a later oscillator stage. For example, the drain of the first stage switch transistor 116 can be coupled to a gate of a first middle stage switch transistor 126, and so forth until a drain of a last middle stage switch transistor 146 can be coupled to a gate of a last stage switch transistor 136.

Figure 2:
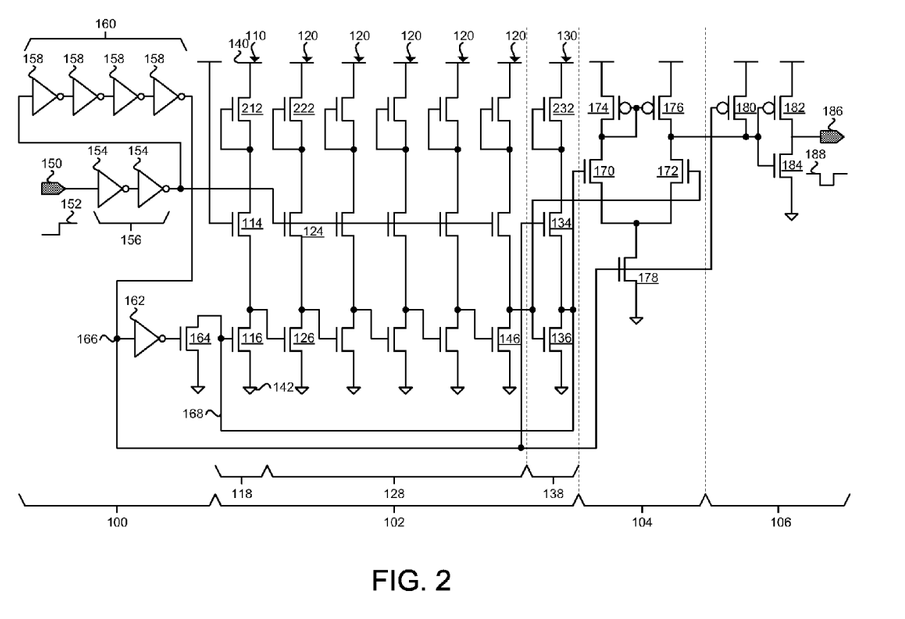
FIG. 2 illustrates a circuit schematic of some embodiments of an n-channel metal-oxide semiconductor (NMOS) source to drain leakage monitor ring oscillator circuit.
Figure 3:
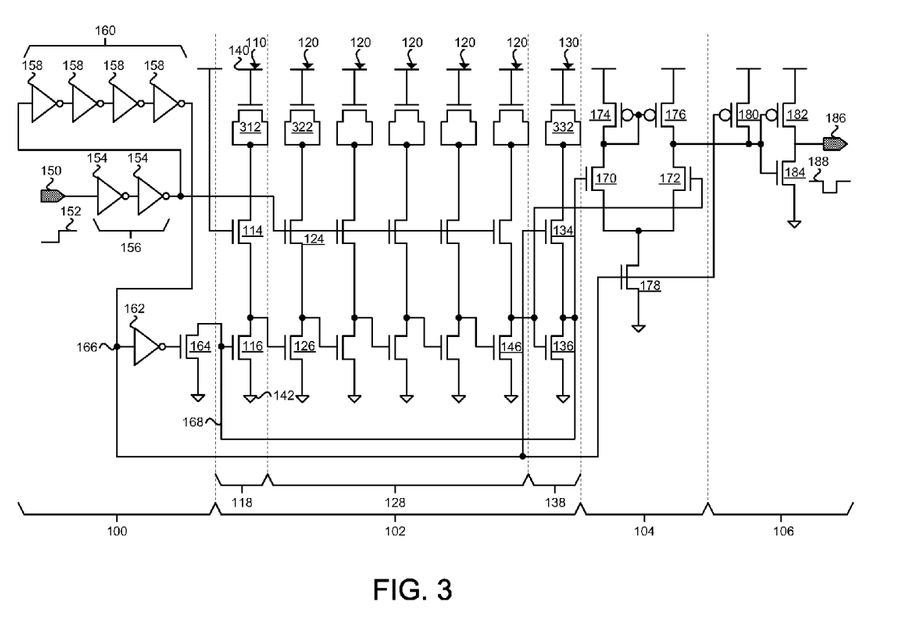
FIG. 3 illustrates a circuit schematic of some embodiments of an n-channel metal-oxide semiconductor (NMOS) gate leakage monitor ring oscillator circuit.
Figure 4:
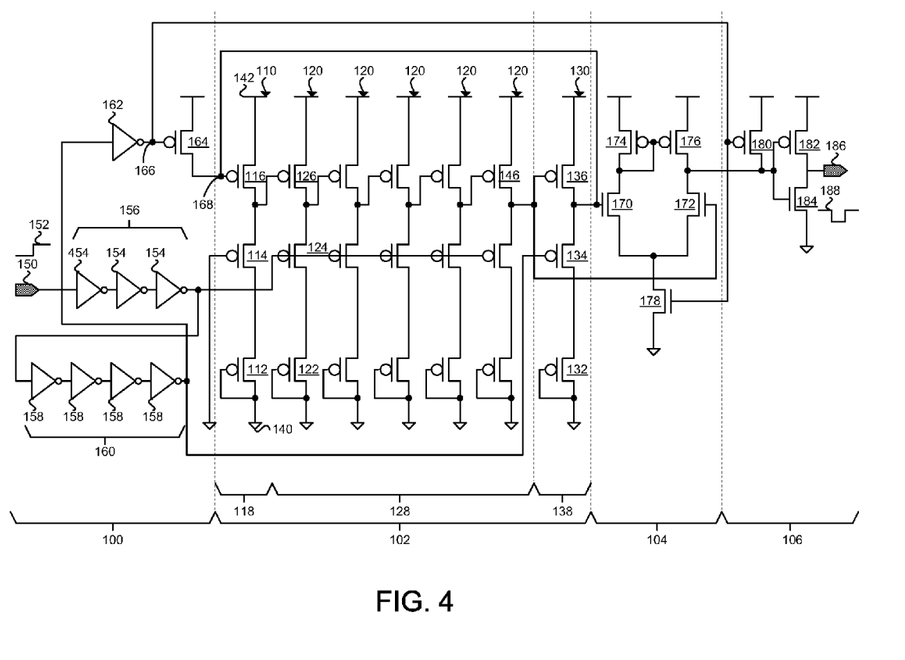
FIG. 4 illustrates a circuit schematic of some embodiments of a p-channel metal-oxide semiconductor (PMOS) reference ring oscillator circuit.
Figure 5:
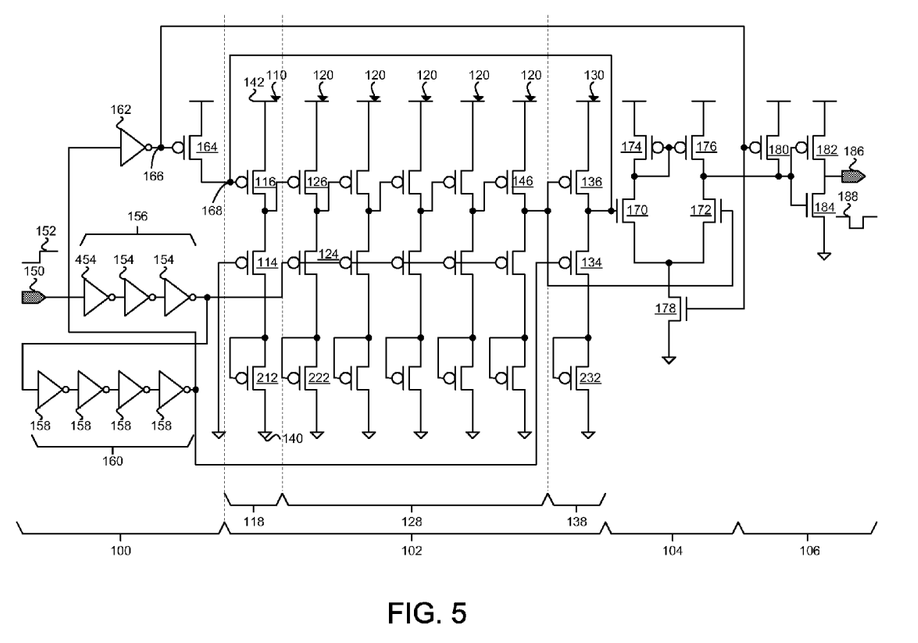
FIG. 5 illustrates a circuit schematic of some embodiments of a p-channel metal-oxide semiconductor (PMOS) source to drain leakage monitor ring oscillator circuit.
Figure 6:
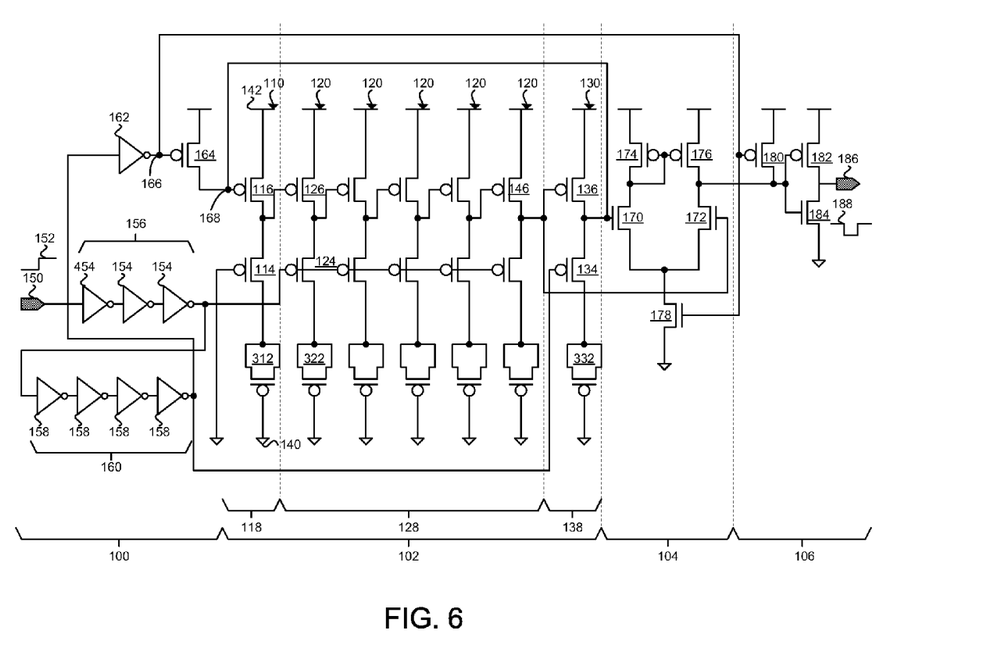
FIG. 6 illustrates a circuit schematic of some embodiments of a p-channel metal-oxide semiconductor (PMOS) gate leakage monitor ring oscillator circuit.

The oscillator sub-circuit 102 can use NMOS transistors as shown in FIGS. 1-3 or PMOS transistors as shown in FIGS. 4-6. The transistors of oscillator sub-circuit may all be a similar type of transistor. For example, all the transistors in the oscillator sub-circuit may be NMOS transistors or PMOS transistors. The oscillator sub-circuit using the NMOS transistors can monitor NMOS processes, and the oscillator sub-circuit using the PMOS transistors can monitor PMOS processes. A source of the switch transistor may be coupled to a constant switch voltage terminal. Using NMOS transistors for the oscillator sub-circuit, the constant load voltage terminal 140 of FIG. 1 may be coupled to a high voltage potential (VCC) and the constant switch voltage terminal 142 of FIG. 1 may be coupled to a low voltage potential (GND). Using PMOS transistors for the oscillator sub-circuit, the constant load voltage terminal 140 of FIG. 4 may be coupled to a low voltage potential and the constant switch voltage terminal 142 of FIG. 4 may be coupled to a high voltage potential.

The input logic sub-circuit 100 may use control logic to enable and disable the ring oscillator. Delay logic 160 delays the enable signal to the last stage to prevent the oscillator from multi mode-oscillating with more than one pulse within the oscillator loop. The delay logic is embodied in this example with inverters, however for those skilled in this art, it may be possible to implement these delays in numerous ways and to produce infinite delay possibilities. The input logic sub-circuit can include two enable inverters 154 coupled in series 156, four delay enabled inverters 158 coupled in series 160, an output pull down inverter 162 with an output pull down terminal 166, an input switch transistor 164 with an input switch terminal 168, and an input conductor 150. An input of the enable inverter series can be coupled to the input conductor. An output of the enable inverter series can be coupled to an input of the delay enabled inverters series and gates of the enable transistors 124 of the middle oscillator stage 128. An output of the delay enabled inverters series can be coupled to an input of the output pull down inverter and a gate of the enable transistor 134 of the last oscillator stage 138. An output of the output pull down inverter can be coupled to a gate of the input switch transistor. A drain of the input switch transistor can be coupled to a gate of the switch transistor 116 of the first oscillator stage 118 and the input switch terminal.

The output pull down terminal 166 may be a coupling point that can change from NMOS ring oscillators shown in FIGS. 1-3 and PMOS ring oscillators shown in FIGS. 4-6. For example on an NMOS ring oscillator embodiments, the output pull down terminal may be coupled to the input of the output pull down inverter 162 and the source of the input switch transistor 164 may be coupled to the low voltage potential. In a PMOS ring oscillator embodiments, the output pull down terminal may be coupled to the output of the output pull down inverter, the source of the input switch transistor may be coupled to a high voltage potential, and a third enable inverter 454 may be added and coupled to the two enable inverters 154 in series 156.

An amplifier sub-circuit 104 may use a differential amplifier to boost the oscillator sub-circuit output waveform, because the output waveform of the oscillator sub-circuit can have a very limited swing due to the fact that the oscillator sub-circuit is built from the transistors of the same polarity, either all nFETs or all pFETs. As will be recognized by those of skill in the art, alternate embodiments of the amplifier may be used including single and dual stage amplifiers. Amplifiers may also use pFETs as can be appreciated. The differential amplifier embodiment in the example amplifier sub-circuit of FIG. 1 may include two nFET input amplifier transistors 170 and 172, two pFET amplifier load transistors 174 and 176, an nFET amplifier pull down transistor 178. The input amplifier transistors may be configured as a differential amplifier with both sources of the input amplifier transistors coupled together and coupled to a drain of the amplifier pull down transistor. A drain of a first input amplifier transistor 170 may be coupled to a drain of a first amplifier load transistor 174 and coupled to both gates of the amplifier load transistors. A drain of a second input amplifier transistor 172 may be coupled to a drain of a second amplifier load transistor 176. A gate of the first input amplifier transistor can be coupled to the input switch terminal 168 and a drain of a switch transistor 136 of the last oscillator stage 138. A gate of the second input amplifier transistor can be coupled to a gate of the switch transistor of the last oscillator stage. A gate of the amplifier pull down transistor can be coupled to the output pull down terminal 166. Both sources of the amplifier load transistors can be coupled to the high voltage potential, and a source of the amplifier pull down transistor can be coupled to the low voltage potential.

The buffer sub-circuit 106 may be used to shape the output voltage from the differential amplifier to a square waveform (a digital wave shaper). As will be recognized by those of skill in the art, alternate embodiments of the buffer sub-circuit may be used. The buffer circuit can include a pFET pull up transistor 180, an output conductor 186, and a pFET inverter transistor 182 and a nFET inverter transistor 184 forming an inverter as shown in the embodiment of FIG. 1. A gate of the pull up transistor can be coupled to the gate of the amplifier pull down transistor 178. A drain of the pull up transistor can be coupled to gates of the inverter transistors (182 and 184) and the drain of the second input amplifier transistor 172. The output conductor can be coupled to drains of the inverter transistors. A source of the pull up transistor and a source of the pFET inverter transistor can be coupled to the high voltage potential, and a source of the nFET inverter transistor can be coupled to the low voltage potential.

The magnitude of the source to drain leakage and gate leakage can be determined using three different ring oscillators for NMOS process and three different ring oscillators for PMOS process. The first of type of ring oscillator that can be used is a reference ring oscillator with the load transistors 112, 122, and 132 operating in saturation, which can be used for detecting the reference speed, as shown in FIG. 1 for NMOS process and in FIG. 4 for PMOS process. The second type of ring oscillator that can be used is a source to drain leakage oscillator with the load transistors 212, 222, and 232 that have source to gate shorted and thus operating in an OFF state with the leakage current flowing between the source and the drain of the load transistors, as shown in FIG. 2 for NMOS process and in FIG. 5 for PMOS process. By subtracting the frequency of the source to drain leakage oscillator from the frequency of reference oscillator, a magnitude of the source to drain leakage can be determined, as can be appreciated. The third type of ring oscillator that can be used is a gate leakage oscillator with the load transistors 312, 322, and 332 that have the source and drain shorted together, operating in an OFF state with the leakage current flowing through the gate of the load transistors, as shown in FIG. 3 for NMOS process and in FIG. 5 for PMOS process. By subtracting its speed from the reference oscillator speed a magnitude of the gate leakage can be determined, as can be appreciated. Speed is determined by the time between an enable pulse 152 applied to the input conductor 150 and a resulting output signal 188 the output conductor 186. It is also possible use the frequencies of oscillation of the 3 types of ring oscillators as independent readouts to use as absolute values not necessarily tied to the reference oscillator configuration.

The advantages of the embodiments described over the currently used CMOS logic leakage oscillator is a 100% isolation of the NMOS leakage and the PMOS leakage from each other. The speed of the leakage ring oscillator is influenced by NMOS leakage and is not influenced by PMOS physical nor electrical parameters like PMOS leakage for a NMOS oscillator or PMOS leakage for PMOS oscillator without influence of NMOS physical nor electrical parameters like NMOS leakage, while the speed of the CMOS leakage oscillator simultaneously influenced by both NMOS and PMOS leakage.

For processes using a standard threshold voltage and channel length (regular VTLE lot) where NMOS processes and PMOS processes trend together, the NMOS ring oscillator and PMOS ring oscillators may perform similarly to a CMOS ring oscillator. Threshold voltage is the voltage used to turn on a transistor. However, when N-P mismatched material is produced, the NMOS and PMOS ring oscillators may be the only reliable process change monitors because the CMOS ring oscillators will not be able to accurately distinguish between NMOS and PMOS process variations as the effects of one will negate fully or to a limited extent the effects of the other. The threshold voltage for PMOS transistors (VTP) and the threshold voltage for NMOS transistors (VTN) may be varied independently. When the VTN and VTP are varied in the opposite direction, the NMOS ring oscillator can be highly correlated to VTN, and PMOS ring oscillator can be highly correlated to VTP, however the CMOS may not be correlated to either threshold voltage (VT-VTN or VTP). The reason the CMOS may not be correlated to VT is because the VTN and VTP were varied in the opposite direction. A change in the VTP may cause the speed of the ring oscillator to increase and while another change in the VTN may cause the speed to decrease, or vice versa. The resulting average effect on the CMOS ring oscillator circuit speed may be small or insignificant. The leakage current (Ioff) can also be a function of the drain current (Id), the channel length (Le), as well as the threshold voltage (Vt), represented by Ioff=f(Id, Vt, Le). Because the Id, Ioff, Le, and Vt parameters may be dependent on each other and may affect leakage current, ring oscillators can be used to monitor Id, Ioff, Le, and Vt parameters. The NMOS and PMOS oscillators may show separation of the N vs. P related parameters, which may not be shown by the CMOS ring oscillator.

With the continued scaling trend of the gate oxide and strict requirements put on power consumption the leakage current can play a significant role in a chip's performance and total power. The leakage oscillators can be useful in process monitoring to determine the cause of process related changes. Source to drain leakage oscillator (FIG. 2 for NMOS and FIG. 5 for PMOS) can provide information about the transistor source, drain and channel characteristics, while the gate leakage oscillator (FIG. 3 for NMOS and FIG. 6 for PMOS) can provide information about the gate characteristics. Because oscillators can also be very sensitive to threshold voltage and channel length changes, they can be also used as the monitors of the threshold voltage and channel length. In addition, ring oscillators can be used to sort semiconductor dies by power usage. The power usage of circuits at hot and cold temperature does not follow the same trend. Sorting die before other high cost operations like die packaging may create a cost savings. The leakage oscillator can have a high temperature coefficient and can be used to monitor the temperature variation profile within a semiconductor die or wafer. Using transistors of both polarities (both NMOS and PMOS ring oscillators) may eliminate skewed results in oscillator speed due to a contribution of the different polarity transistor's parameters of CMOS oscillators.

The embodiments illustrated by FIG. 2 is similar to FIG. 1, except the load transistors can be used as a source to drain leakage monitor circuit with a gate and a source of the load transistors 212, 222, and 232 coupled together. The embodiments illustrated by FIG. 3 is similar to FIG. 1, except the load transistors can be used as a gate leakage monitor circuit with a drain and the source of the load transistor 312, 322, and 332 coupled together.

The embodiments illustrated by FIG. 4 include a PMOS implementation of the NMOS reference ring oscillator circuit in FIG. 1, except the oscillator sub-circuit 102 transistors 112, 114, 116, 122, 124, 126, 132, 134, 136, and 146 (212, 222, and 232 in FIG. 5, and 312, 322, and 332 in FIG. 6) and the input switch transistor 164 may be pFETs instead of nFETs. The PMOS implementation also includes an additional enable inverter 454 forming three enable inverters coupled in series 156, and the output pull down terminal 166 coupling point which may be connect to a different point in the PMOS circuit from the NMOS circuit. The output pull down terminal may be coupled to the output of the output pull down inverter 162 (instead of the input of the output pull down inverter as in FIG. 1). The constant load voltage terminal 140 may be coupled to a low voltage potential (instead of a high voltage potential as in FIG. 1) and the constant switch voltage terminal 142 may be coupled to a high voltage potential (instead of a low voltage potential as in FIG. 1).

The embodiments illustrated by FIG. 5 are similar to FIG. 4, except the load transistors can be used as a source to drain leakage monitor circuit with a gate and a source of the load transistors 212, 222, and 232 coupled together (similar to FIG. 2). The embodiments illustrated by FIG. 6 are similar to FIG. 4, except the load transistors can be used as a gate leakage monitor circuit with a drain and the source of the load transistor 312, 322, and 332 coupled together (similar to FIG. 3).

Having described the preferred aspects of the devices and associated methods, it is understood that the appended claims are not to be limited by particular details set forth in the above description, as many apparent variations thereof are possible without departing from the spirit or scope thereof.

The invention claimed is:

1. A circuit forming an oscillator stage, comprising:
    a load transistor, wherein the coupling of the load transistor comprises a gate and a drain of the load transistor and a constant load voltage terminal coupled together, a gate and a source of the load transistor coupled together and the drain of the load transistor coupled to a constant load voltage terminal, or a drain and the source of the load transistor coupled together and the gate of the load transistor coupled a constant load voltage terminal;
    an enable transistor having a source of the load transistor coupled to a drain of the enable transistor;
    a switch transistor having a source of the enable transistor coupled to a drain of the switch transistor and a source of the switch transistor coupled to a constant switch voltage terminal, wherein the load transistor, enable transistor, and switch transistor comprise a similar type of transistor and form an oscillator stage, wherein the load transistor, enable transistor, and switch transistor comprise n-channel field effect transistors (FETs) with the constant load voltage terminal coupled to a high voltage potential, the constant switch voltage terminal coupled to the low voltage potential, or p-channel FET transistors with the constant load voltage terminal coupled to a low voltage potential, and wherein the constant switch voltage terminal is coupled to a high voltage potential; and
    an odd plurality of oscillator stages that are coupled together with the drain of the switch transistor of an earlier oscillator stage are coupled to a gate of the switch transistor of a later oscillator stage, wherein the odd plurality of oscillator stages comprises a first oscillator stage, an odd plurality of middle oscillator stages, and a last oscillator stage, and wherein a gate of the enable transistor of the first oscillator stage is coupled to the constant load voltage terminal.

2. The circuit of claim 1, wherein the number of odd plurality of oscillator stages is seven.

3. The circuit of claim 1, wherein the gates of the middle oscillator stages are coupled together.

4. An oscillator circuit, comprising:
an input logic sub-circuit;
an oscillator sub-circuit having an odd plurality of oscillator stages wherein the oscillator stage comprises a load transistor, an enable transistor with a source of the load transistor coupled to a drain of the enable transistor, a source of the enable transistor coupled to a drain of the switch transistor, and a source of the switch transistor coupled to a constant switch voltage terminal, wherein the load transistor, enable transistor, and switch transistor comprise a similar type of transistor, wherein the coupling of the load transistor comprises a gate and a drain of the load transistor and a constant load voltage terminal coupled together, a gate and a source of the load transistor coupled together and the drain of the load transistor coupled to a constant load voltage terminal, or a drain and the source of the load transistor coupled together and the gate of the load transistor coupled to a constant load voltage terminal, wherein the load transistor, enable transistor, and switch transistor comprise n-channel field effect transistors (FETs) with the constant load voltage terminal coupled to a high voltage potential, the constant switch voltage terminal coupled to the low voltage potential, or p-channel FET transistors with the constant load voltage terminal coupled to a low voltage potential, wherein the constant switch voltage terminal is coupled to a high voltage potential, the oscillator sub-circuit further comprising an odd plurality of oscillator stages that are coupled together with the drain of the switch transistor of an earlier oscillator stage coupled to a gate of the switch transistor of a later oscillator stage, wherein the odd plurality of oscillator stages comprises a first oscillator stage, an odd plurality of middle oscillator stages, and a last oscillator stage, and wherein a gate of the enable transistor of the first oscillator stage is coupled to the constant load voltage terminal;
an amplifier sub-circuit;
a buffer sub-circuit.

5. The circuit of claim 4, wherein the number of odd plurality of oscillator stages is seven.

6. A circuit forming an oscillator stage, comprising:
a load transistor, wherein the coupling of the load transistor comprises a gate and a drain of the load transistor and a constant load voltage terminal coupled together, a gate and a source of the load transistor coupled together and the drain of the load transistor coupled to a constant load voltage terminal, or a drain and the source of the load transistor coupled together and the gate of the load transistor coupled a constant load voltage terminal;
an enable transistor having a source of the load transistor coupled to a drain of the enable transistor, wherein a gate of the enable transistor of the oscillator stage is coupled to the constant load voltage terminal; and
a switch transistor having a source of the enable transistor coupled to a drain of the switch transistor and a source of the switch transistor coupled to a constant switch voltage terminal, wherein the load transistor, enable transistor, and switch transistor comprise a similar type of transistor and form an oscillator stage.

* * * * *